United States Patent
Lim et al.

(10) Patent No.: US 8,686,776 B2
(45) Date of Patent: Apr. 1, 2014

(54) PHASE ROTATOR BASED ON VOLTAGE REFERENCING

(75) Inventors: Daihyun Lim, West New York, NY (US); Marcel A. Kossel, Reichenburg (CH); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 13/556,237

(22) Filed: Jul. 24, 2012

(65) Prior Publication Data

US 2014/0028363 A1 Jan. 30, 2014

(51) Int. Cl.
*H03H 11/16* (2006.01)

(52) U.S. Cl.
USPC .......................................... 327/237; 327/231

(58) Field of Classification Search
None
See application file for complete search history.

(56) References Cited

U.S. PATENT DOCUMENTS

| | | | |
|---|---|---|---|
| 6,259,295 B1 * | 7/2001 | Kriz et al. | 327/296 |
| 6,646,483 B2 | 11/2003 | Shin | |
| 6,874,109 B1 | 3/2005 | Rajski et al. | |
| 7,109,768 B2 | 9/2006 | Rashid | |
| 7,138,841 B1 | 11/2006 | Li et al. | |
| 7,221,724 B2 * | 5/2007 | Schell | 375/355 |
| 7,224,759 B2 | 5/2007 | White | |
| 7,532,053 B2 * | 5/2009 | Rausch | 327/231 |
| 7,656,986 B2 | 2/2010 | Chen | |
| 7,688,929 B2 | 3/2010 | Co | |
| 7,755,413 B2 | 7/2010 | Wong | |
| 7,800,451 B2 | 9/2010 | Fu et al. | |
| 7,894,563 B2 | 2/2011 | Robinson et al. | |
| 7,928,788 B2 | 4/2011 | Jiang | |
| 7,956,657 B2 | 6/2011 | Lim et al. | |
| 7,961,025 B2 * | 6/2011 | Rylov | 327/231 |
| 8,050,373 B2 | 11/2011 | Buchwald et al. | |
| 8,164,373 B2 * | 4/2012 | Kossel et al. | 327/231 |
| 2007/0075759 A1 * | 4/2007 | Metz et al. | 327/158 |

* cited by examiner

*Primary Examiner* — Cassandra Cox
(74) *Attorney, Agent, or Firm* — Howard M. Cohn; Ian D. MacKinnon

(57) ABSTRACT

A phase rotator based on voltage referencing is disclosed. A voltage signal is generated that is proportional to the phase difference between two input signals. The voltage signal is then used as the upper voltage limit for a digital-to-analog converter (DAC). The DAC is programmable via an input vector to generate a DAC output. The DAC output is used to generate a phase rotated (phase shifted) output, which is at an intermediate phase between the two input signals.

18 Claims, 13 Drawing Sheets

US 8,686,776 B2

PHASE ROTATOR BASED ON VOLTAGE REFERENCING

FIELD OF THE INVENTION

The present invention relates generally to electronic circuits, and more particularly to phase shift and duty cycle correction in clock generation circuits.

BACKGROUND OF THE INVENTION

Many electronic systems include one or more synchronous components that rely on receiving related signals at substantially the same time to maintain proper operating characteristics of the electronic system. A computer system is one example of a synchronous system that may include a multitude of interrelated system components, each designed to perform a particular operation in response to a clock signal. In some cases, data transfer between system components may be synchronized by one or more clock signals originating from a common source. The system components may receive the clock signals through a clocking network, which may include clock generation and distribution circuits.

Phase rotators (interpolators) are commonly used to generate fine phase steps for accurate timing control in various electronic applications such as high-speed serial links and DDR (double data rate) memory applications. Phases generated from a multi-phase PLL or delay line are further interpolated by a bank of phase rotators to provide more (and finer) phases which are then used by calibration mechanisms to park at the right sampling timing.

In some cases, variation in the arrival of a clock signal transition relative to a data signal transition may significantly impact system performance and reliability. For this reason, good clock distribution tends to be very important in the overall performance and reliability of electronic systems. Therefore, it is desirable to have an improved phase rotator.

SUMMARY OF THE INVENTION

In one embodiment, a system for providing a programmable clock phase is provided. The system comprises a phase separation module configured and disposed to receive a first input signal and a second input signal and generate an integrative signal, a reference DAC supply module configured and disposed to receive the integrative signal from the phase separation module and output a DAC reference voltage, and a phase creator module, comprising a DAC and an output signal generation circuit. The phase creator module is configured and disposed to use the DAC reference voltage as an input to the DAC. The DAC is configured and disposed to output a DAC output voltage signal, and the DAC output voltage signal is configured to control the output signal generation circuit.

In another embodiment, a system for providing a programmable clock phase is provided. The system comprises a phase separation module configured and disposed to receive a first input signal and a second input signal and generate an integrative signal. The phase separation module comprises an XOR gate configured and disposed to receive the first input signal and the second input signal, and generate an RFCLK signal. The system further comprises a first rising edge pulse generator and a falling edge pulse generator configured and disposed to receive the second input signal, an OR gate configured and disposed to receive an output of the first rising edge pulse generator and the falling edge pulse generator and generate an RST_RF signal, an integrator, configured and disposed to receive the RFCLK signal at a signal input, and configured and disposed to receive the RST_RF signal at a reset input, and generate an RF_INT signal.

In another embodiment, a method for generating a programmable clock phase is provided. The method comprises receiving a first input signal and a second input signal, wherein the second input signal is a phase-shifted signal of similar frequency as the first input signal, generating an integrative signal proportional to a phase difference between the first input signal and the second input signal, generating a DAC reference voltage as a function of the integrative signal, inputting the DAC reference voltage into a DAC in a phase creation module, and outputting a phase-shifted clock signal from the phase creation module, wherein the phase-shifted clock signal is a function of the DAC reference voltage.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. In some cases, in particular pertaining to signals, a signal name may be oriented very close to a signal line without a lead line to refer to a particular signal, for illustrative clarity.

Figure 1:
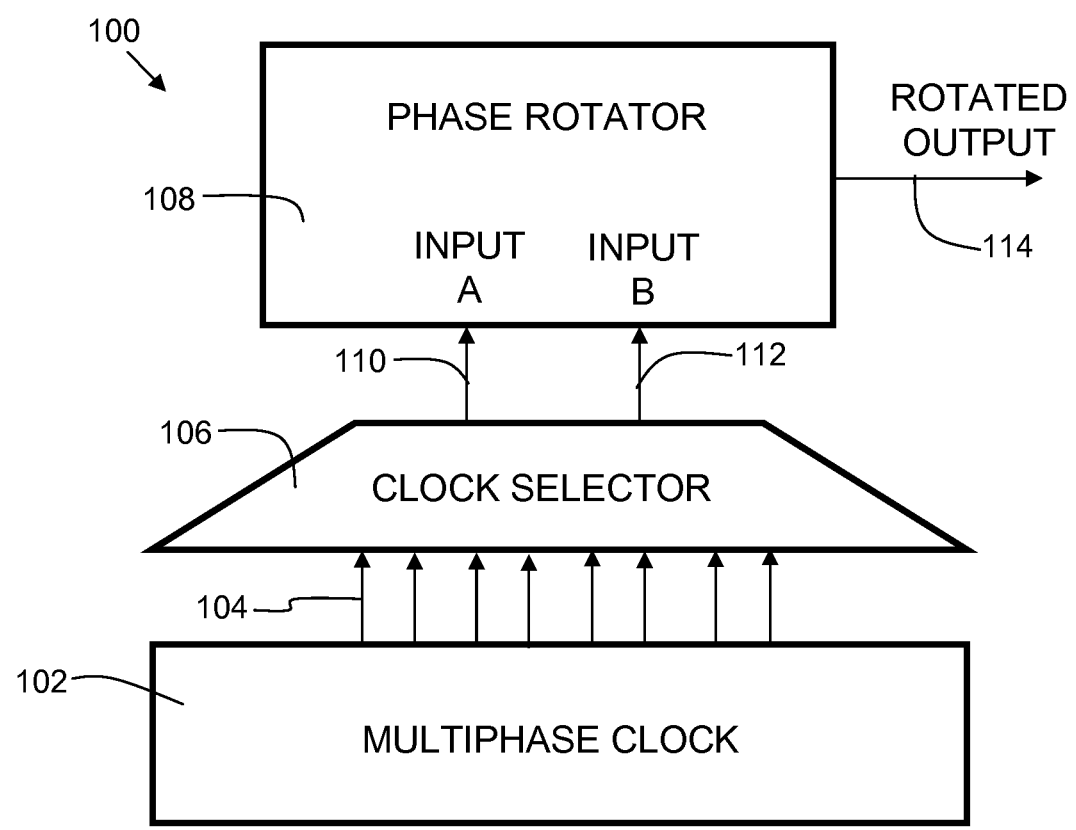

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a general system diagram of an embodiment of the present invention.

Figure 2:
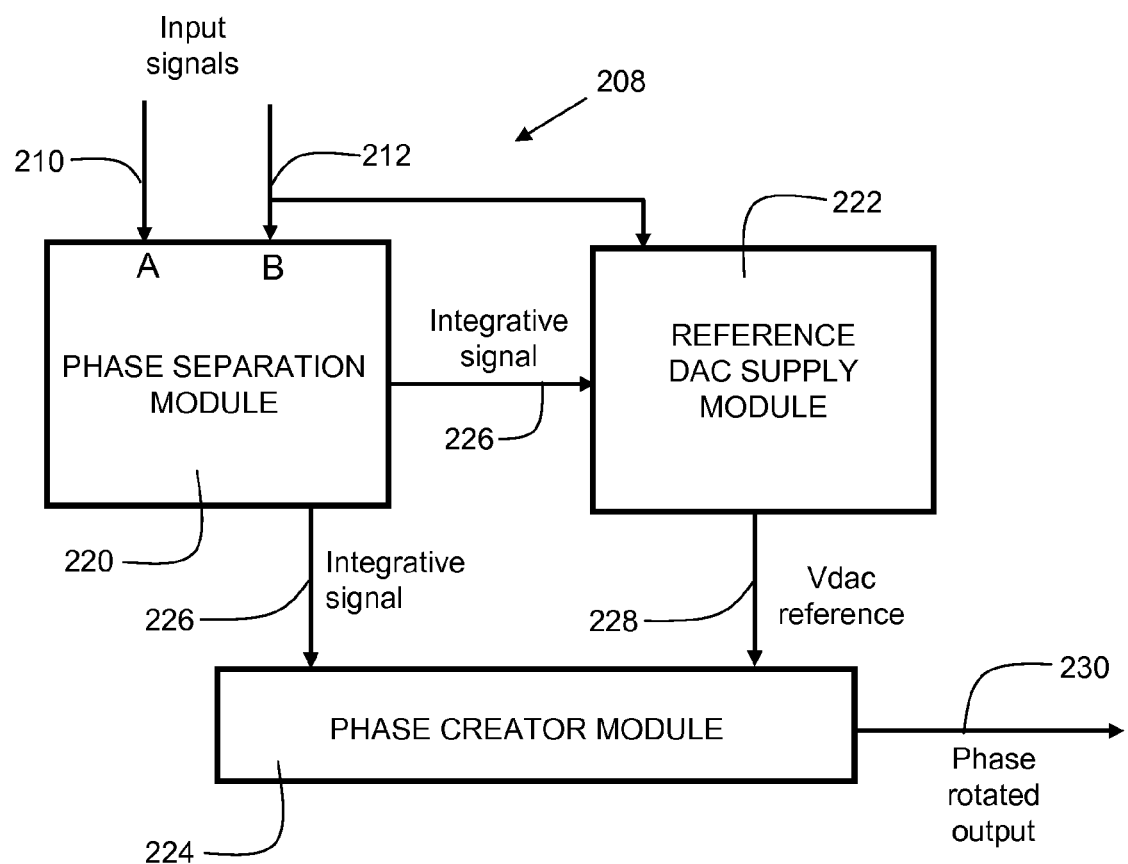

FIG. 2 is a system diagram of a phase rotator in accordance with an embodiment of the present invention.

Figure 3:
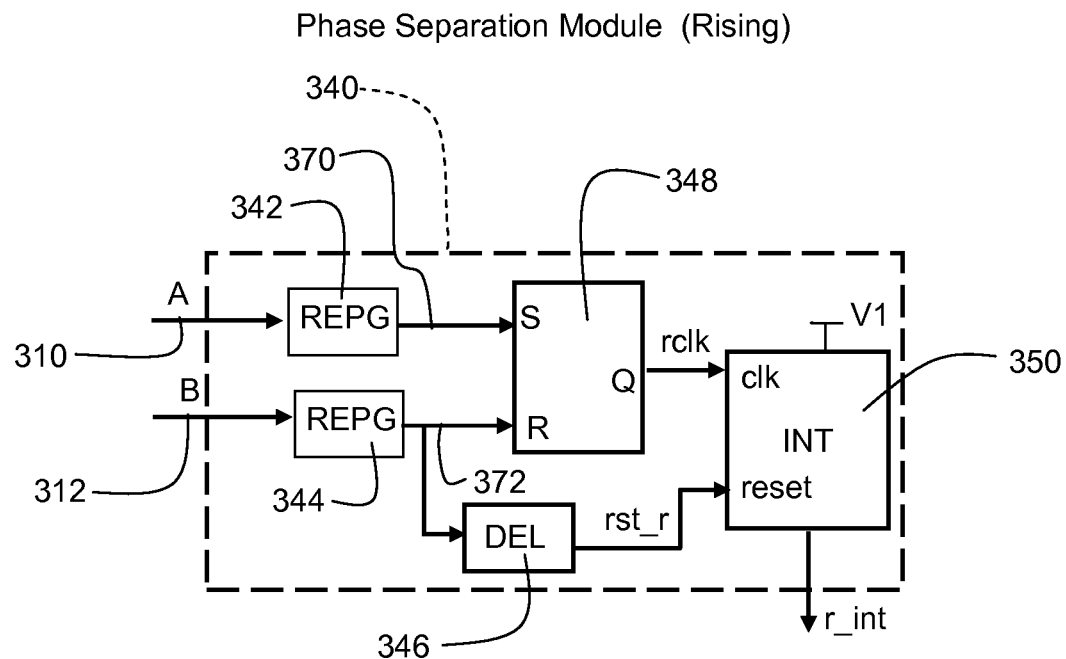

FIG. 3 shows details of a phase separation circuit for the detection of rising edges.

Figure 4:
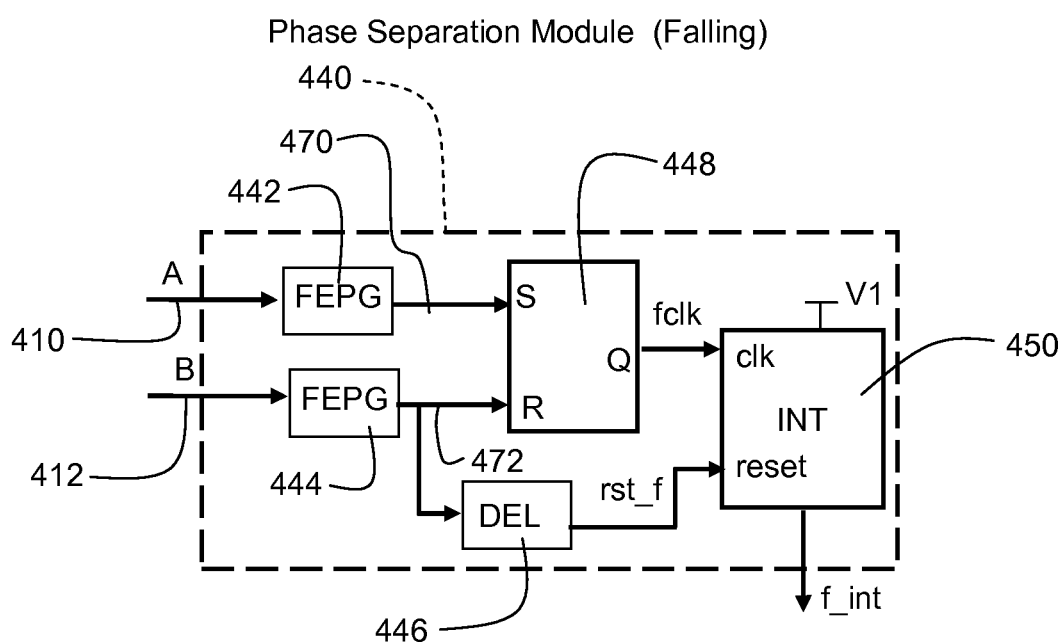

FIG. 4 shows details of a phase separation circuit for the detection of falling edges.

Figure 5:
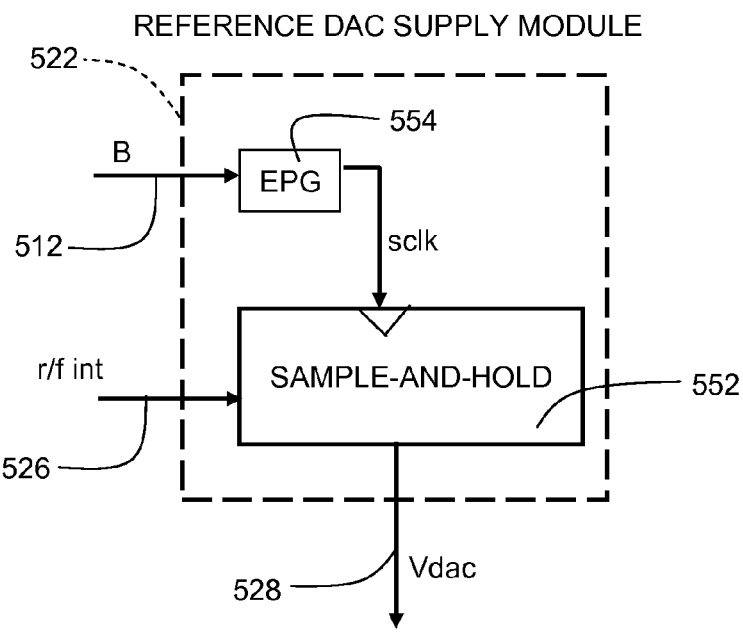

FIG. 5 shows details of a reference DAC supply module circuit.

Figure 6A:
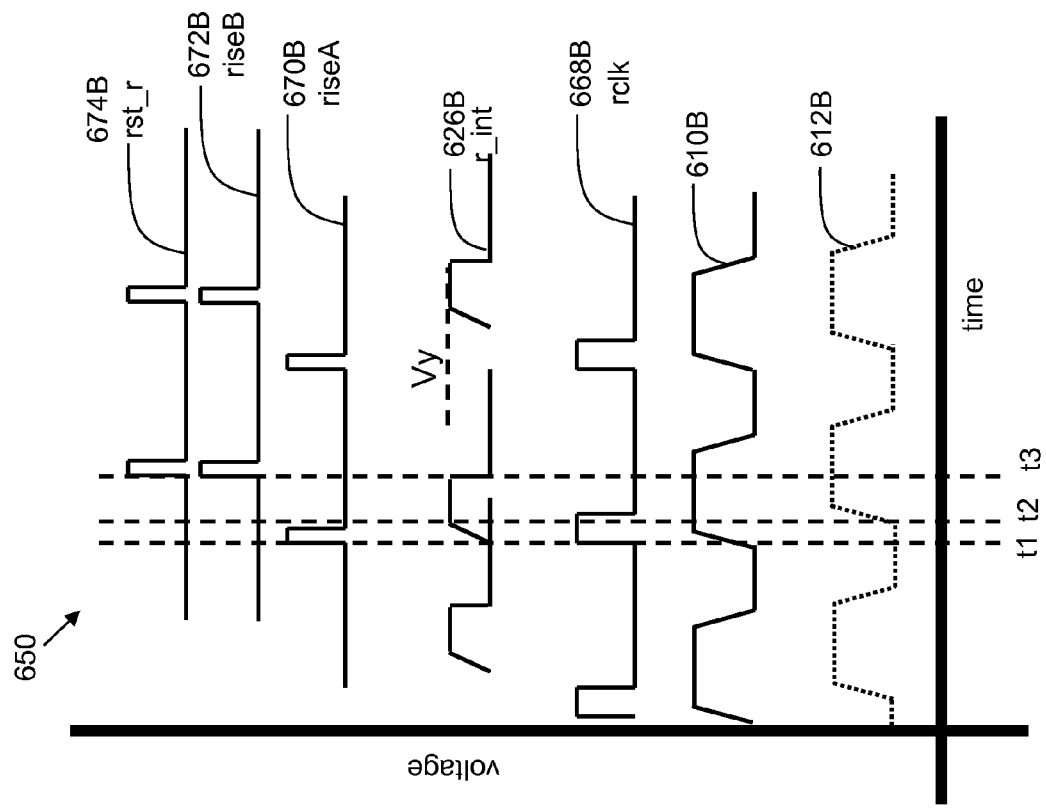
Figure 6B:
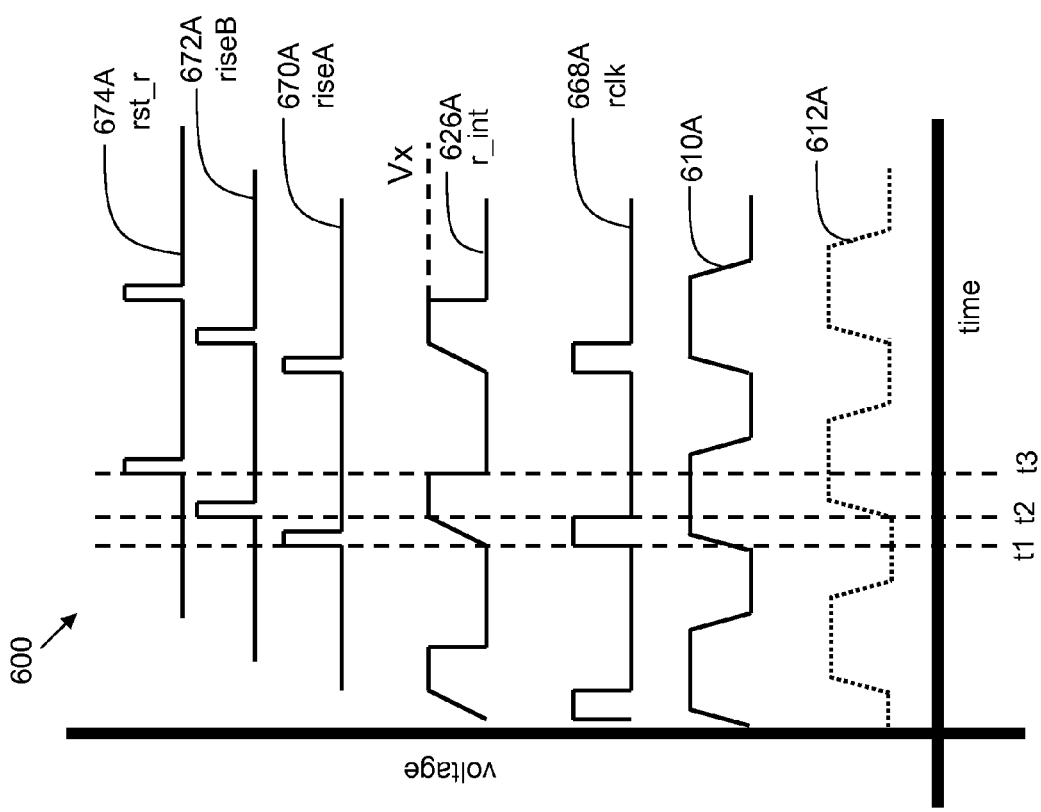

FIGS. 6A and 6B show example rising edge phase separation circuit waveforms for two different input phases.

Figure 7:
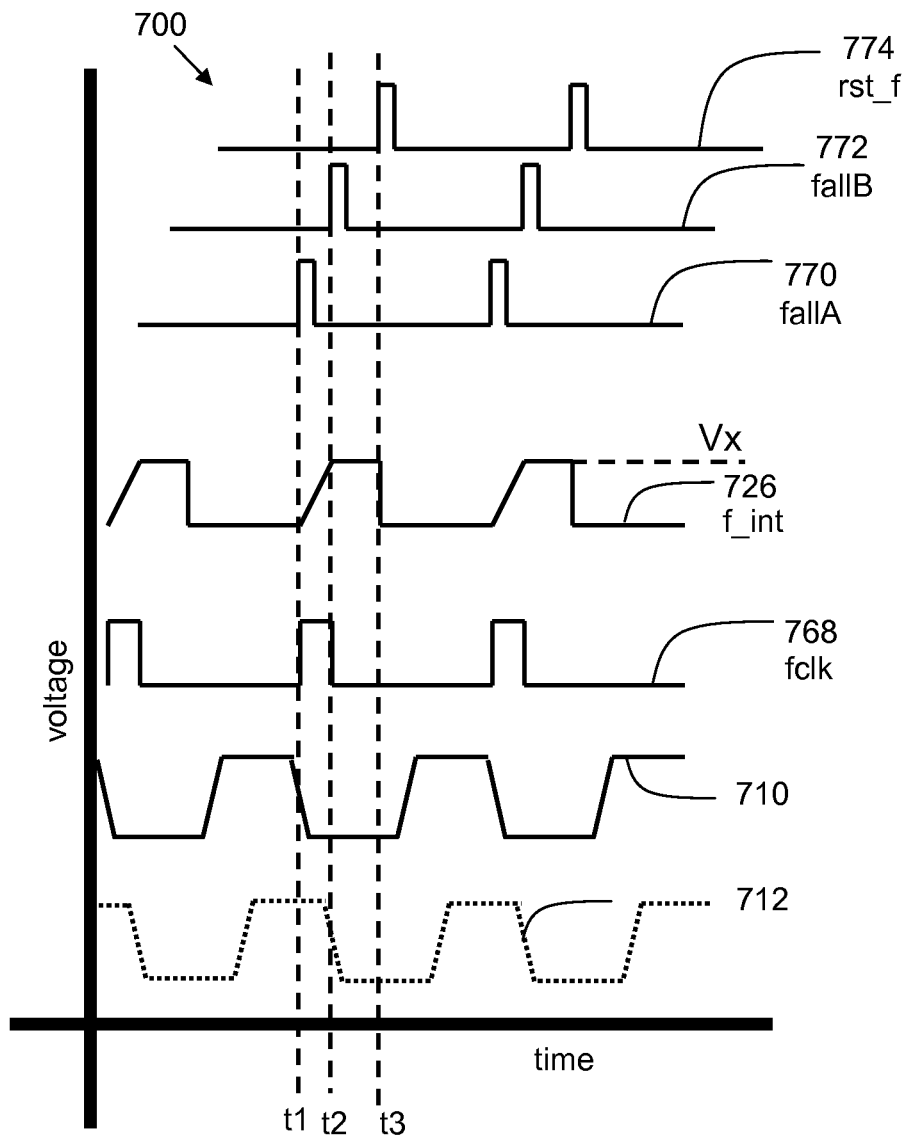

FIG. 7 shows an example waveform for a falling edge phase separation circuit.

Figure 8A:
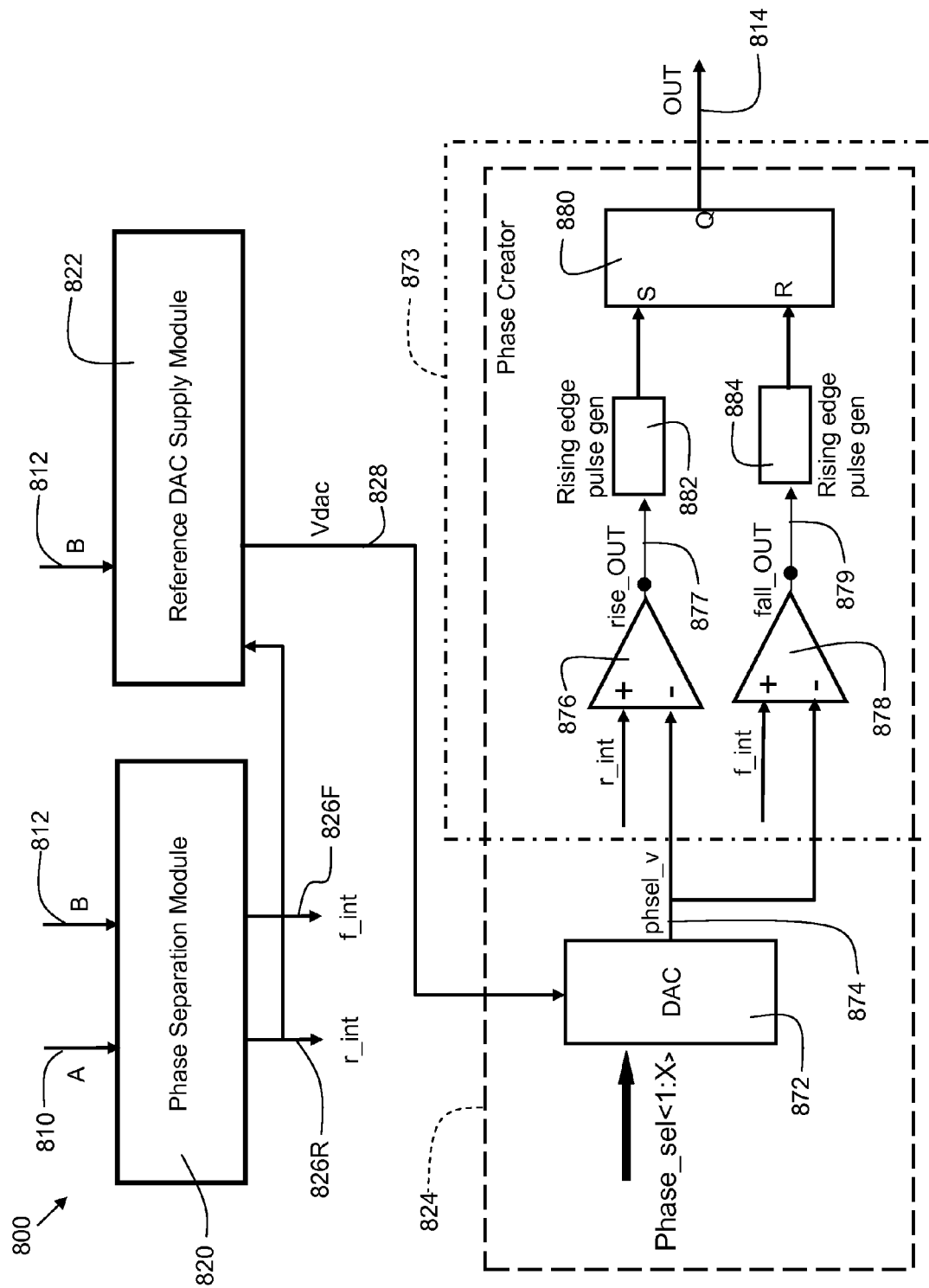

FIG. 8A shows an embodiment of a phase rotator of FIG. 2 with details of an associated phase creator module circuit.

Figure 8B:
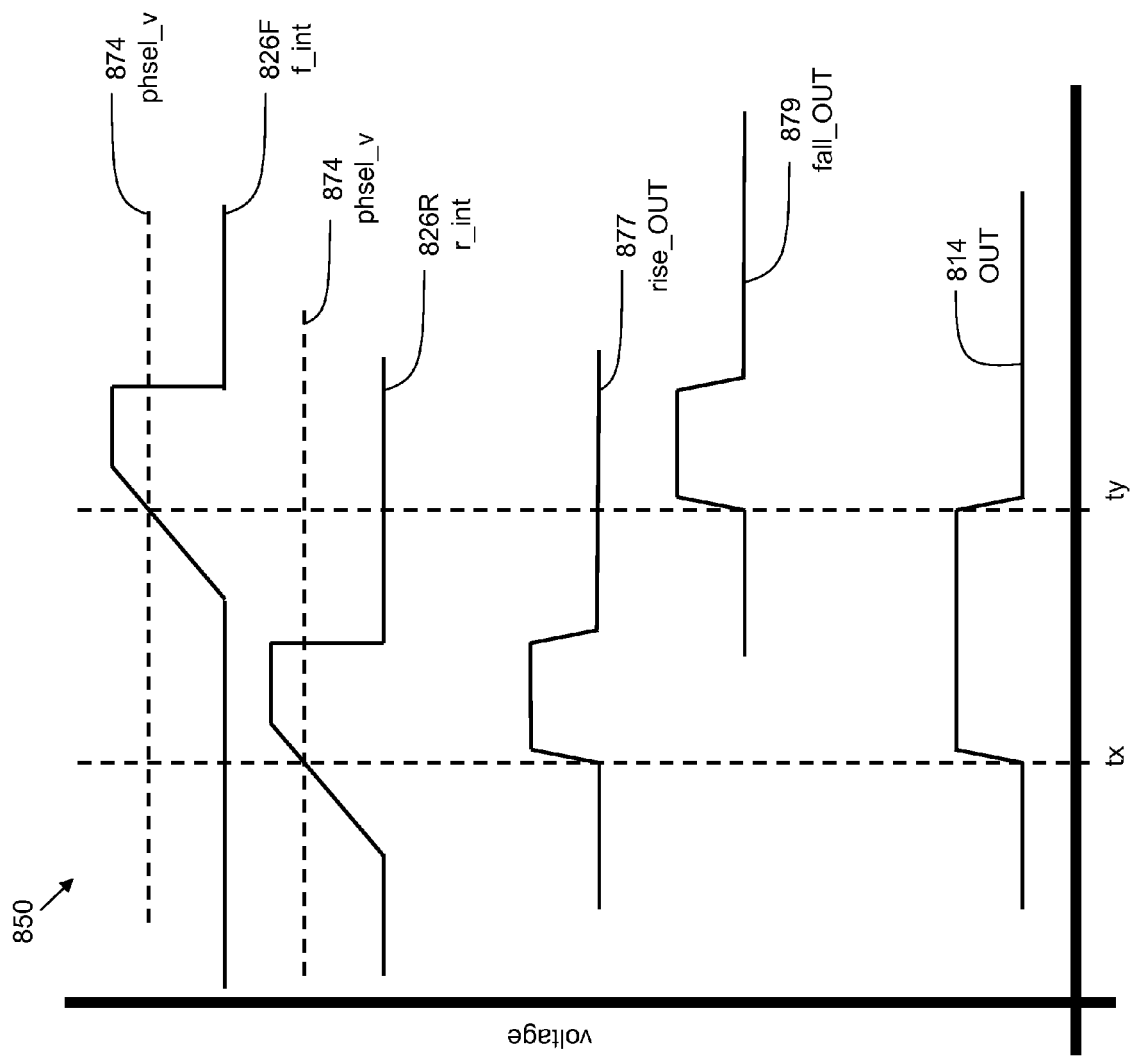

FIG. 8B shows an example waveform for the phase creator module circuit of FIG. 8A.

Figure 10:
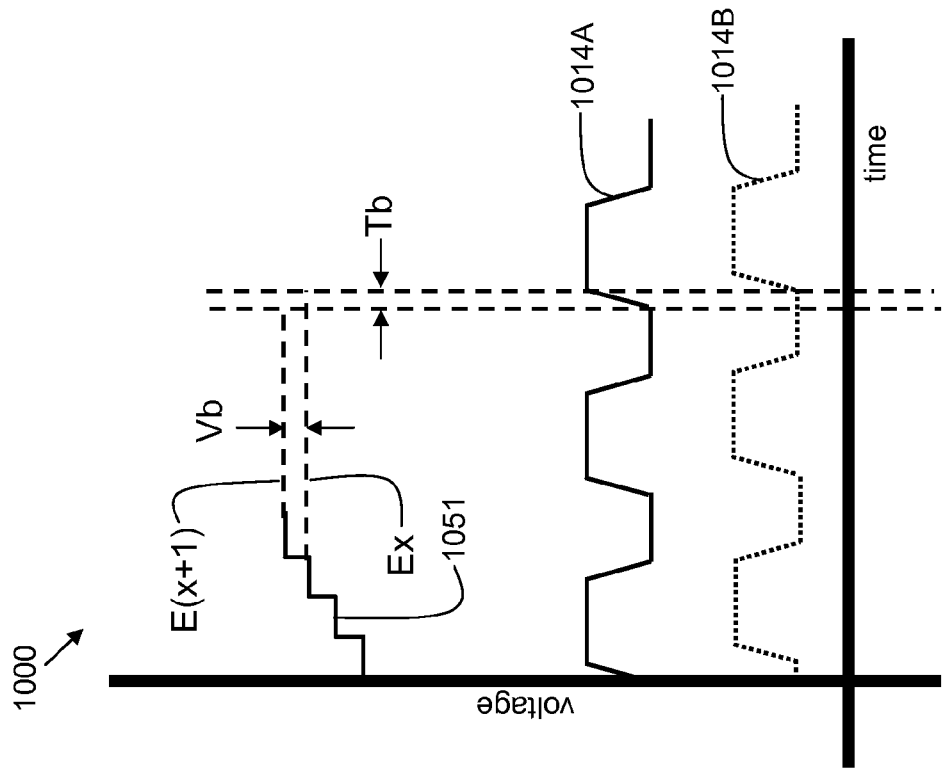
Figure 9:
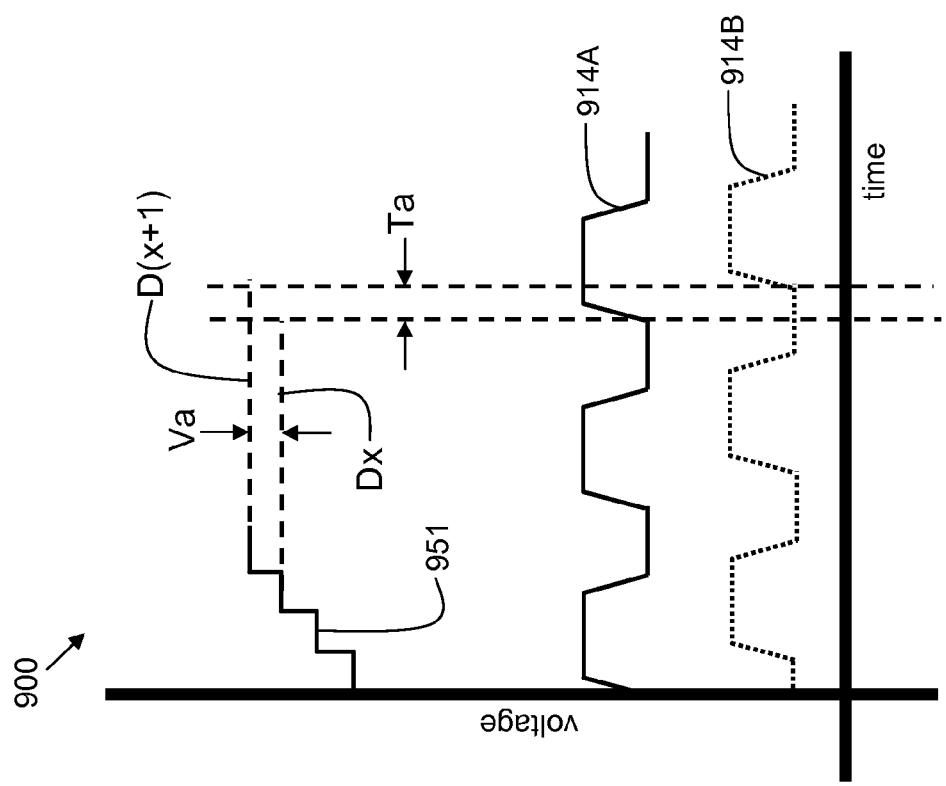

FIGS. 9 and 10 show example DAC steps and corresponding outputs for two different input phases.

Figure 11A:
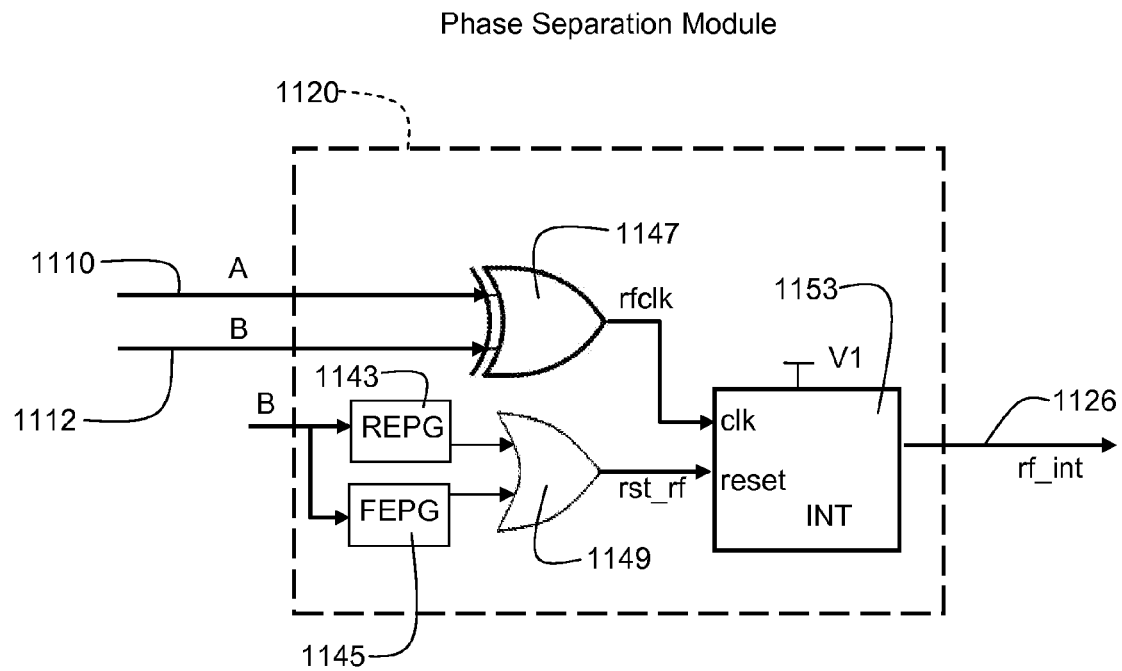

FIG. 11A shows an alternative embodiment of a phase separation module circuit.

Figure 11B:
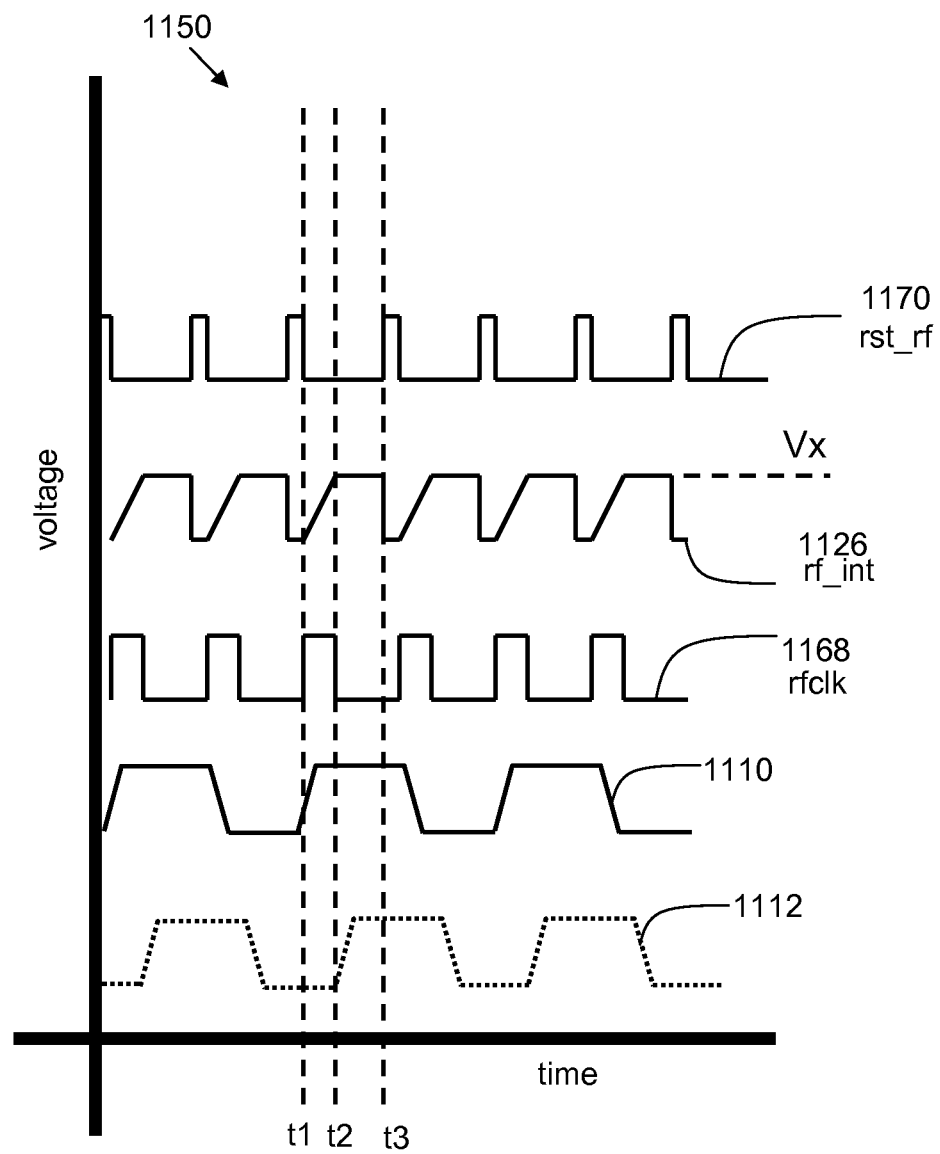

FIG. 11B shows an example waveform for the phase separation module circuit of FIG. 11A.

Figure 12A:
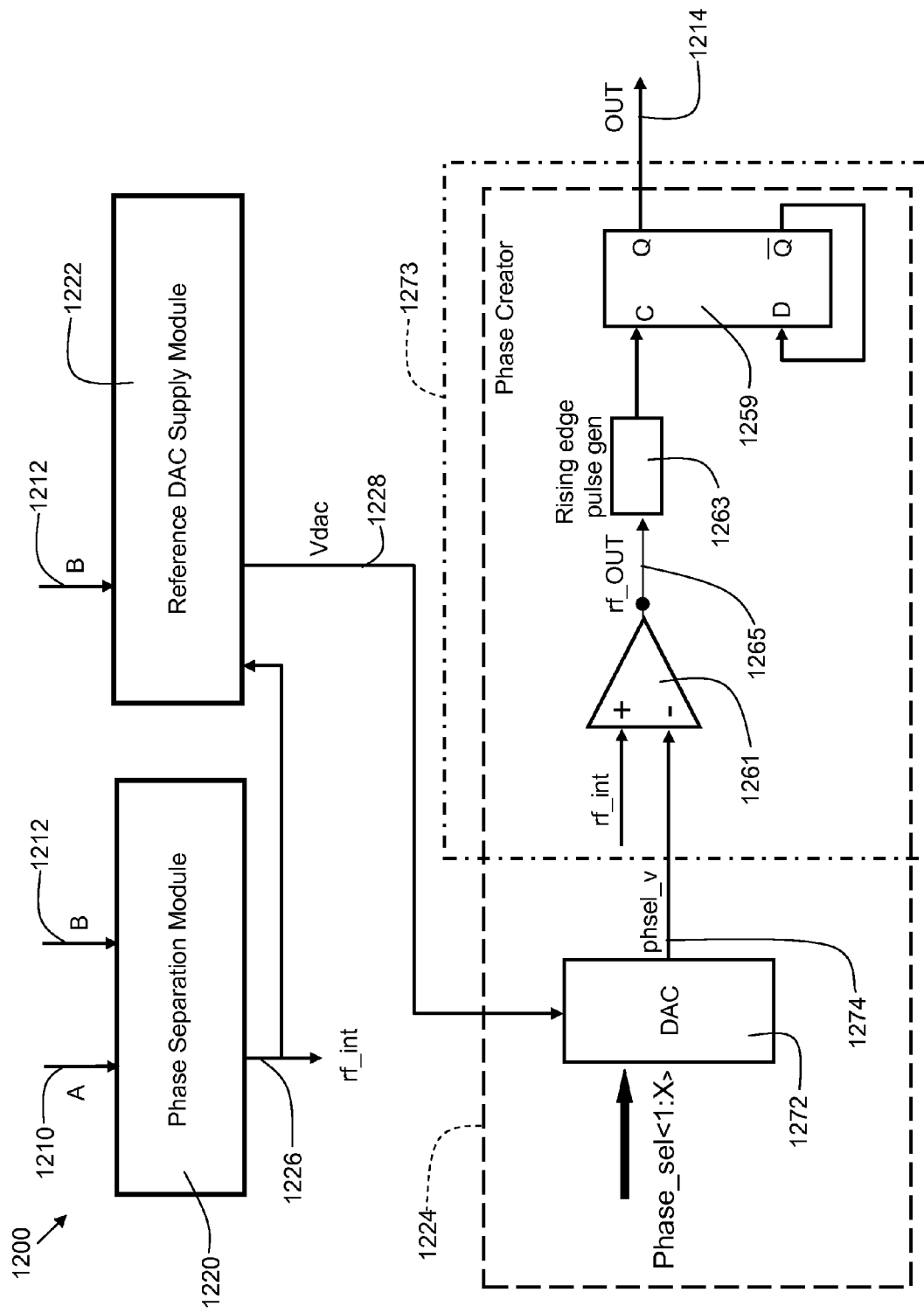

FIG. 12A shows details of an alternative embodiment for a phase rotator of FIG. 2 with details of an alternate embodiment of a phase creator module circuit.

Figure 12B:
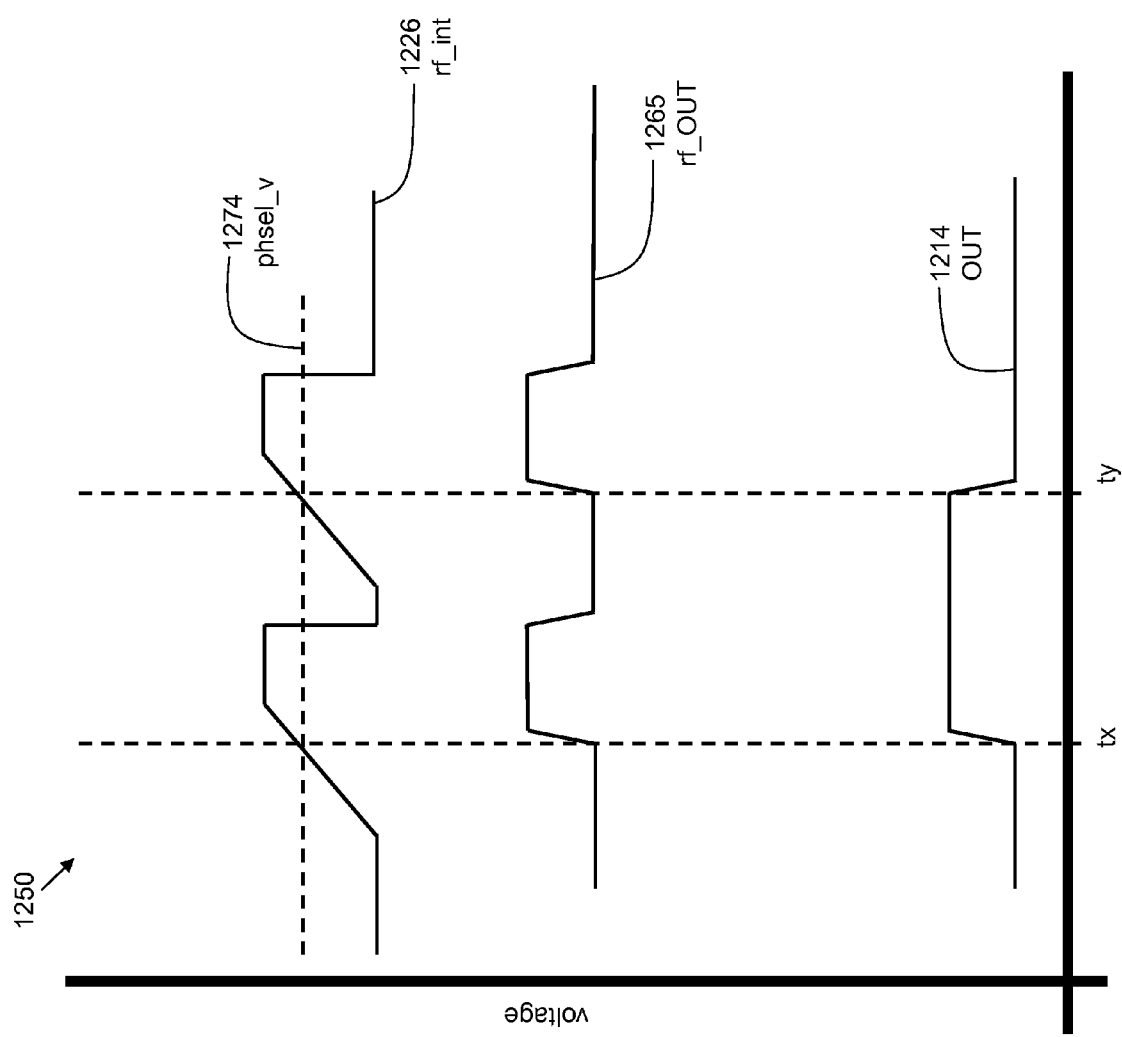

FIG. 12B shows an example waveform for the phase creator module circuit of FIG. 12A.

Figure 13:
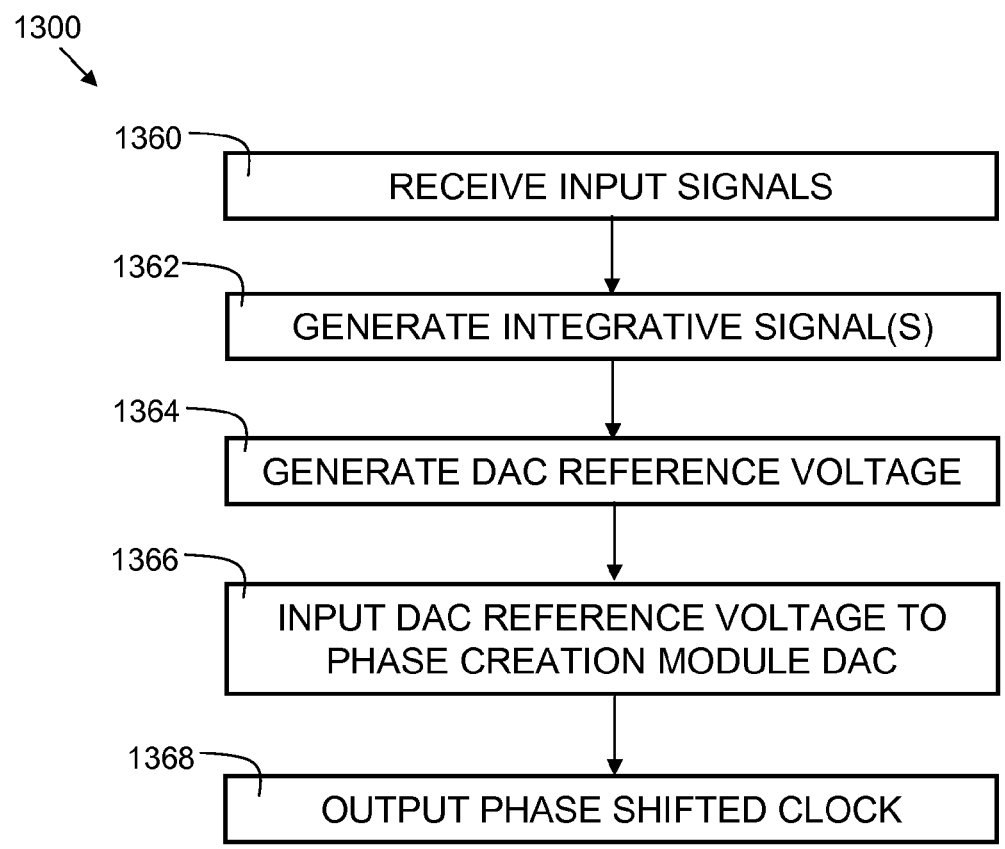

FIG. 13 shows a flowchart indicating process steps for an embodiment of the present invention.

DETAILED DESCRIPTION

Embodiments of the present invention provide a novel phase rotator. A voltage signal is generated that is proportional to the phase difference between two input signals. The voltage signal is then used as the upper voltage limit for a digital-to-analog converter (DAC). The DAC is programmable via an input vector to generate a DAC output. The DAC output is used to generate a phase rotated (phase shifted) output, which is at an intermediate phase between the two input signals. Embodiments of the present invention provide an advantage of performing interpolation independent of the incoming signal slew, and hence, reduces the need for complex slew rate control circuitry.

FIG. 1 is a general system diagram of a system 100 in accordance with an embodiment of the present invention. A multiphase clock 102 provides a plurality of multiphase clock signals 104 which are of similar frequency, with each having a different phase. The multiphase clock signals 104 may originate from a voltage controlled oscillator (VCO) or be available from different tap points of a delayline. A clock selector circuit 106 allows selection of two of the multiphase clock signals as input signals 110 and 112. The input signals 110 and 112 are of similar frequency, with a phase separation between them. In general, the two input signals may be referred to as Input A and Input B. Input signals 110 and 112 are input into phase rotator 108. Phase rotator 108 generates a phase rotated (i.e. phase shifted) output 114. The output signal 114 is "interpolated" or "rotated" to a desired phase that is in between the phase of input 110 and input 112. For example, considering a case where input signal 110 leads input signal 112 by 22.5 degrees, then interpolating evenly between input signal 110 and input signal 112 results in a rotated output signal with a phase shift of 11.25 degrees from input signal 110. Hence, system 100 provides a programmable clock phase for output signal 114.

FIG. 2 is a system diagram of a phase rotator 208 in accordance with an embodiment of the present invention. Phase rotator 208 comprises a phase separation module 220, a reference DAC supply module 222, and a phase creator module 224. Input signals 210 and 212 are input to the phase separation module. The input signals 210 and 212 are of similar frequency, with a phase separation between them. The phase separation module 220 generates an integrative signal that is proportional to the phase difference between input signal 210 and 212. An input signal (e.g. input signal 212) is input to the reference DAC supply module 222 along with the integrative signal 226. The input signal 212 is supplied to the reference DAC supply module 222 for the purposes of synchronizing a sample-and-hold circuit which creates the Vdac reference output 228. The Vdac reference output 228 and the integrative signal 226 are input to the phase creator module 224. The output of the phase creator module 224 is a phase rotated output 230, where the phase rotated output 230 has the same frequency as input signals 210 and 212, and a phase in between the input signals 210 and 212.

In some embodiments, an electronic system may utilize multiple phase rotators of the type similar to phase rotator 100 of FIG. 1. In some embodiments, each phase rotator may utilize a different pair of input signals. This may be desirable to interpolate between a different pair of phases but whose time delta between input signals A and B is constant, which implies that input signals for a given phase rotator have similar timing characteristics (e.g. jitter).

In other embodiments, the multiphase clock (102 of FIG. 1) may be used to supply input signals to multiple phase rotators. In such an embodiment, there may be a single phase separation module and reference DAC supply module providing signals to multiple phase creator modules, which can save area on an integrated circuit.

In some embodiments, the phase separation module comprises a circuit for the detection of rising edges and a circuit for the detection of falling edges. FIG. 3 shows details of a rising separation circuit 340 which is part of a phase separation module. Input signals 310 and 312 are input to the phase separation module 340. The input signals 310 and 312 are of similar frequency, with a phase separation between them. Input signal 310 is input to a rising edge pulse generator (REPG) 342. REPG 342 generates riseA signal 370, which is a short pulse, upon detecting a rising edge of input signal 310. Similarly, REPG 344 generates riseB signal 372, which is a short pulse upon detecting a rising edge of input signal 312. The output of REPG 342 is input to the set (S) signal of set-reset latch 348. The output of REPG 344 is input to the reset (R) signal of set-reset latch 348. The resulting output signal rclk 368 is output from the output Q of the set-reset latch 348. The rclk signal 368 is a pulse, where the pulse width is proportional to the rising-edge phase difference between inputs 310 and 312. The greater the phase difference between inputs 310 and 312, the wider the rclk signal pulse is. The rclk signal 368 is input into integrator 350. The output of the integrator 350 is integrative signal r_int. The integrator 350 has a reference voltage of V1. The integrative signal increases as the width of the rclk pulse increases, up to the maximum value of the reference voltage V1. The input signal 312 is also input to a delay circuit 346 which generates a delayed pulse on the rising edge of input signal 312, which is the rst_r signal 374. The rst_r signal 374 is input to the reset input of the integrator 350 to reset it.

FIG. 4 shows details of a falling separation circuit 440 which is part of a phase separation module. The operation of phase separation module falling circuit 440 is similar to that of phase separation module rising circuit 340. Input signals 410 and 412 are input to the phase separation module 440. The input signals 410 and 412 are of similar frequency, with a phase separation between them. Input signal 410 is input to a falling edge pulse generator (FEPG) 442. FEPG 442 generates fallA signal 470, which is a short pulse, upon detecting a falling edge of input signal 410. Similarly, FEPG 444 generates fallB signal 472, which is a short pulse upon detecting a falling edge of input signal 412. The output of FEPG 442 is input to the set (S) signal of set-reset latch 448. The output of FEPG 444 is input to the reset (R) signal of set-reset latch 448. The resulting output signal fclk 468 is output from the output Q of the set-reset latch 448. The fclk signal 468 is a pulse, where the pulse width is proportional to the falling-edge phase difference between inputs 410 and 412. The greater the phase difference between inputs 410 and 412, the wider the fclk signal pulse is. The fclk signal 468 is input into integrator 450. The output of the integrator 450 is integrative signal f_int. The integrator 450 has a reference voltage of V1. The integrative signal increases as the width of the fclk pulse increases, up to the maximum value of the reference voltage V1. The input signal 412 is also input to a delay circuit 446 which generates a delayed pulse on the rising edge of input signal 412, which is the rst_f signal 474. The rst_f signal 474 is input to the reset input of the integrator 450 to reset it.

FIG. 5 shows details of a reference DAC supply module circuit 522. The input signal 512 (the lagging input signal) is input to an edge pulse generator (EPG) 554. Depending on the configuration, EPG 554 may be either a rising edge pulse generator or a falling edge pulse generator. The output of EPG 554 is a sclk signal used to control when sample-and-hold circuit 552 samples the integrative signal 526. Depending on the configuration, integrative signal 526 may be r_int (from FIG. 3), f_int (from FIG. 4) or a combined integrative signal. The output of the sample-and-hold circuit 528 is the Vdac voltage that is used as a reference for a DAC within the phase creator module (224 of FIG. 2).

FIGS. 6A and 6B show example rising edge phase separation circuit waveforms for two different input phases. FIG. 6A shows a waveform chart 600 shown alongside FIG. 6B, which shows waveform chart 650 for comparison with each other. Waveform chart 600 shows input signal 610A and input signal 612A. The input signals 610A and 612A are of similar frequency, with a phase separation between them. Input signal 610A starts a rising edge at time t1 and input signal 612A starts a rising edge at time t2. Hence, the phase difference between input signal 610A and input signal 612A is based on the time difference t2-t1. The start of a rising edge on input signal 610A causes a pulse on riseA signal 670A. Similarly, the start of a rising edge on input signal 612A causes a pulse on riseB signal 672A. Signal 668A is rclk (see FIG. 3). Signal 668A rises on a rising edge of input signal 610A, which occurs at time t1. Signal 668A falls on a rising edge of input signal 612A, which occurs at time t2. Hence, the greater the time difference t2-t1, the more time signal 668A is in a high state. Signal 626A is the integrative signal r_int (see FIG. 3). Signal 626A increases in voltage to a level of Vx until it is reset at time t3 by rst_r signal 674A. The voltage Vx is dependent on how long signal 668A is in a high state which is in turn dependent on the time difference t2-t1.

FIG. 6B shows waveform chart 650 which is similar to waveform chart 600 of FIG. 6. Waveform chart 650 shows input signal 610B and input signal 612B. The input signals 610B and 612B are of similar frequency, with a phase separation between them. Input signal 610B starts a rising edge at time t1 and input signal 612B starts a rising edge at time t2. Hence, the phase difference between input signal 610B and input signal 612B is based on the time difference t2-t1. The start of a rising edge on input signal 610B causes a pulse on riseA signal 670B. Similarly, the start of a rising edge on input signal 612B causes a pulse on riseB signal 672B. Signal 668B is rclk (see FIG. 3). Signal 668B rises on a rising edge of input signal 610B, which occurs at time t1. Signal 668B falls on a rising edge of input signal 612B, which occurs at time t2. Signal 626B is the integrative signal r_int (see FIG. 3). Signal 626B increases in voltage to a level of Vy until it is reset at time t3 by rst_r signal 674B. The voltage Vy is dependent on how long signal 668B is in a high state which is in turn dependent on the time difference t2-t1.

Waveform chart 650 is similar to waveform chart 600 of FIG. 6A, except that there is less phase shift between input signals 610B and 612B than between input signals 610A and 612A of FIG. 6A.

And therefore:

$$Vx > Vy.$$

The integrative signal (such as 626A or 626B) is input into the reference DAC supply module to generate the DAC reference voltage for the phase creator module (see 224 of FIG. 2). Hence, the closer the input signals are in time to each other (the smaller the phase difference between them) the lower the DAC reference voltage is.

FIG. 7 shows an example waveform chart 700 for a falling edge phase separation circuit. The waveform chart 700 is similar to waveform chart 600 of FIG. 6A, except that it is driven by falling edges. The input signals 710 and 712 are of similar frequency, with a phase separation between them. Input signal 710 starts a falling edge at time t1 and input signal 712 starts a falling edge at time t2. Hence, the phase difference between input signal 710 and input signal 712 is based on the time difference t2-t1. The start of a falling edge on input signal 710 causes a pulse on fallA signal 770. Similarly, the start of a falling edge on input signal 712 causes a pulse on fallB signal 772. Signal 768 is fclk (see FIG. 4). Signal 768 rises on a falling edge of input signal 710, which occurs at time t1. Signal 768 falls on a falling edge of input signal 712, which occurs at time t2. Hence, the greater the time difference t2-t1, the more time signal 768 is in a high state. Signal 726 is the integrative signal f_int (see FIG. 4). Signal 726 increases in voltage to a level of Vx until it is reset at time t3 by rst_f signal 774. The voltage Vx is dependent on how long signal 768 is in a high state which is in turn dependent on the time difference t2-t1.

FIG. 8A shows a phase rotator system 800 with details of an embodiment of a phase creator module circuit 824. The phase creator module circuit 824 comprises DAC 872 and output signal generation circuit 873. The voltage reference signal Vdac 828 is supplied from the reference DAC supply module 822. Voltage reference signal Vdac 828 is a sampled voltage of r_int or f_int at a specific time interval. If r_int is chosen, then voltage Vx of FIG. 6A is sampled between times t2 and t3. Such a sampling may be done by an REPG on signal B 812. If f_int is chosen, then voltage Vx of FIG. 7 may be sampled between time intervals t2 and t3. Such a sampling could be done by a FEPG on signal B 812 (FIG. 8A).

The DAC reference voltage Vdac 828 is used as the reference voltage for the DAC 872. The output of the DAC 872 is a DAC output voltage signal (phase select voltage signal) 874 (phsel_v). The DAC output voltage is configured to control the output signal generation circuit 873. In this embodiment, two integrative signals, 826R (r_int) and 826F (f_int) are supplied from phase separation module 820, and input to the phase creator module circuit 824. The r_int signal 826R is input to comparator 876 and the f_int signal 826F is input to comparator 878. The other input to the comparators 876 and 878 is the phase select voltage signal 874 (phsel_v). The operation of comparators 876 and 878 is such that when the integrative signal (r_int or f_int) exceeds the voltage level of phsel_v, the corresponding output signal (rise_OUT or fall_OUT) is asserted. This is supplied to set-reset latch 880. The voltage level of phsel_v determines when the set input (S) to the set-reset latch is asserted, and hence determines when output 814 is asserted. Similarly, the fall_OUT signal is input to the reset input (R) of the set-reset latch 880 to put the output signal 814 into a low state. The frequency of the output signal 814 is the same as the inputs 810 and 812, but the phase is in between the two signals. The voltage level of phsel_v adjusts the phase of the output signal 814. The DAC 872 has an input vector Phase_sel<1:X> which represents a number of bits of input, which correspond to a number of possible voltage values for phsel_v. For example, in an embodiment with a 4-bit input vector, there are 16 (2^4) possible input values, ranging from 0 volts to Vdac volts (signal 828). A larger value of Vdac results in a greater incremental step between adjacent values of the input vector. Optionally, a rising edge pulse generator 882 may be used to condition the rise_OUT signal prior to inputting it into the S input of set-reset latch 880. Similarly, an optional rising edge pulse generator 884 may be used to condition the fall_OUT signal prior to inputting it into the R input of set-reset latch 880.

FIG. 8B shows an example waveform chart 850 for the phase creator module circuit of FIG. 8A. When integrative signal r_int (826R) rises to the voltage level of phsel_v (874) at time tx, it causes a pulse on rise_OUT (877). This causes the output OUT (814) to assert to a high state. Similarly, when integrative signal f_int (826F) rises to the voltage level of phsel_v (874) at time ty, it causes a pulse on fall_OUT (879), which in turn, causes the output OUT (814) to go to the low state. FIGS. 9 and 10 are waveform charts showing example DAC steps and corresponding outputs for two different input phases.

FIG. 9 shows a waveform chart 900 shown alongside FIG. 10, which shows waveform chart 1000 for comparison with each other. Referring to FIG. 9, DAC output step chart 951 indicates four possible step values (corresponding to a DAC with a 2 bit input vector, shown here for the purposes of illustration). In practice, there may be more bits to the input vector, such as 8 or 16 bits, for example, to allow many more possible step values. The voltage difference between two adjacent input vector values (e.g. between inputting a value of 2 compared with a value of 3) is indicated as Va, where:

$$Va = Vdac/\text{input\_vector\_size}$$

Where Vdac is the reference voltage (e.g. 528 from FIG. 5) from the reference DAC supply module, and the input_vector_size is the number of possible steps the DAC 872 supports. For example, with Vdac as 5 volts, and an input_vector_size of 8, then Va is 0.625 volts. The voltage step Va controls phsel_v (874 of FIG. 8), and hence controls the amount of time shift (Ta) achieved with each input vector increment. Output waveform 914A represents an output of the phase creator module (824 of FIG. 8) with the DAC input vector value set to Dx, and output waveform 914B represents an output of the phase creator module (824 of FIG. 8) with the DAC input vector value set to D(x+1). Hence, the time difference Ta is dependent on how close in phase the two input signals (610 and 612 of FIG. 6) are.

FIG. 10 shows a waveform chart 1000 which is similar to waveform chart 900 of FIG. 9. Referring to FIG. 10, DAC output step chart 1051 indicates four possible step values for a case where the input signals (610B and 612B) are closer in phase than those corresponding to waveform chart 900 of FIG. 9 (input signals 610A and 612A). The voltage step Vb controls phsel_v (874 of FIG. 8), and hence controls the amount of time shift (Tb) achieved with each input vector increment. The voltage step Vb is controlled by the Vdac signal. For example, with Vdac as 4 volts, and an input_vector size of 8, then Vb is 0.5 volts. Output waveform 1014A represents an output of the phase creator module (824 of FIG. 8) with the DAC input vector value set to Ex, and output waveform 1014B represents an output of the phase creator module (824 of FIG. 8) with the DAC input vector value set to E(x+1). Because the input signals 610B and 612B (FIG. 6B) have a smaller phase difference than input signals 610A and 612A (FIG. 6A), then the reference voltage for the DAC (872 of FIG. 8) is smaller for the case of input signals 610B and 612B than with input signals 610A and 612A. As a result, when comparing waveform chart 900 with waveform chart 1000, Va>Vb, and Ta>Tb. Therefore, the phase interpolation adjustment is finer when the input signals are closer together and coarser when the input signals are temporally further apart.

FIG. 11A shows an alternative embodiment of a phase separation module 1120. Unlike the phase separation module described in FIGS. 3 and 4, which generates two integrative signals (r_int and f_int), phase separation module 1120 generates a combined integrative signal (rf_int) 1126. Input signals 1110 and 1112 are input to the phase separation module 1120. The input signals 1110 and 1112 are of similar frequency, with a phase separation between them. The input signals 1110 and 1112 are input into an exclusive-or (XOR) gate 1147, and the output signal (rfclk 1168) is active whenever the input signals are in opposing states (e.g. input signal 1110 is high and input signal 1112 is low). Hence, the closer in phase that input signal 1110 and 1112 are, the more time that rfclk is in a low state. Conversely, when input signal 1110 and 1112 are further apart in phase, rfclk is in a high state for a greater percentage of time. The rfclk signal 1168 is input to the clk input of integrator 1153. The integrator 1153 has a reference voltage of V1. The integrative signal increases as the width of the rfclk pulse increases, up to the maximum value of the reference voltage V1. The input signal 1112 is also input to a rising edge pulse generator 1143 and a falling edge pulse generator 1145. The output of rising edge pulse generator 1143 and falling edge pulse generator 1145 is input to a logical OR gate 1149 to generate a reset signal rst_rf 1170 which is input to the reset input of integrator 1153. Hence, the integrator reset signal rst_rf 1170 is based on a logical OR of a pulse generated at the rising edge of the second signal and a pulse generated at the falling edge of the second signal. This results in a reset of the integrator 1153 any time the input signal 1112 has a rising or falling edge. The resulting rf_int signal 1126 is used in an alternative embodiment of a phase creator module described in FIG. 12.

FIG. 11B shows an example waveform chart 1150 for the phase separation module circuit of FIG. 11A. Waveform chart 1150 shows input signal 1110 and input signal 1112. The input signals 1110 and 1112 are of similar frequency, with a phase separation between them. Input signal 1110 starts a rising edge at time t1 and input signal 1112 starts a rising edge at time t2. Hence, the phase difference between input signal 1110 and input signal 1112 is based on the time difference t2−t1. The input signals 1110 and 1112 are input to XOR gate 1147, which outputs rfclk signal 1168. Signal 1126 is the integrative signal rf_int (see FIG. 11A). Signal 1126 increases in voltage to a level of Vx until it is reset at time t3 by rst_rf signal 1170. The voltage Vx is dependent on how long signal 1168 is in a high state which is in turn dependent on the time difference t2−t1.

FIG. 12A shows a phase rotator 1200 indicating details of an alternative embodiment of a phase creator module circuit 1224. Phase creator module circuit 1224 performs a similar function as phase creator module circuit 824. However, whereas phase creator module circuit 824 uses two integrative signals (r_int and f_int), phase creator module circuit 1224 utilizes only one combined integrative signal (rf_int) 1226 from phase separation module 1220. Phase creator module circuit 1224 comprises DAC 1272 and output signal generation circuit 1273. DAC 1272 outputs phase select voltage signal 1274 (phsel_v), similar to the embodiment of FIG. 8. However, in phase creator module circuit 1224, there is one comparator 1261, which compares rf_int against phsel_v, and generates the rf_OUT signal. The rf_OUT signal is input to the clock input (C) of a D-flip-flop 1259. The complement output (Q-bar) is fed back into the D input of the flip-flop. The resulting output signal 1214 is then clocked at a frequency equivalent to that of the input signals 1210 and 1212, and phase shifted by an amount depending on the value of Vdac 1228 coming from reference DAC supply module 1222, and the input vector value Phase_sel<1:X>. Optionally, a rising edge pulse generator 1263 may be used to condition the rf_OUT signal prior to inputting it into the flip-flop 1259. Voltage reference signal Vdac 1228 is a sampled voltage of rf_int at a specific time interval. The voltage Vx of FIG. 11B may be sampled between times t2 and t3. Such a sampling could be done by an REPG and/or an FEPG on signal B 812 (FIG. 8A).

FIG. 13 shows a flowchart 1300 indicating process steps for an embodiment of the present invention. In process step 1360, input signals are received (see 210 and 212 of FIG. 2) into a phase separation module. In process step 1362, one or more integrative signals are generated. In the case of the embodiment of FIG. 8, two integrative signals (r_int and f_int) are generated. In the case of the embodiment of FIG. 12, a single combined integrative signal (rf_int) is generated. In process step 1364, a DAC reference voltage is generated (see 528 of FIG. 5). In process step 1366, the DAC reference voltage is input to a phase creation module (see 828 of FIG. 8). In process step 1368 a phase shifted (phase rotated, or interpolated) clock is output (see 814 of FIG. 8).

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A system for providing a programmable clock phase, comprising:
 a phase separation module configured and disposed to receive a first input signal and a second input signal and generate an integrative signal;
 a reference DAC supply module configured and disposed to receive the integrative signal from the phase separation module and output a DAC reference voltage; and
 a phase creator module, comprising a DAC and an output signal generation circuit, and wherein the phase creator module is configured and disposed to use the DAC reference voltage as an input to the DAC, and wherein the DAC is configured and disposed to output a DAC output voltage signal, and wherein the DAC output voltage signal is configured to control the output signal generation circuit and wherein the reference DAC supply module comprises:
 a sample-and-hold circuit configured and disposed to receive the integrative signal;
 a reference DAC edge pulse generator configured to activate the sample-and-hold circuit, wherein the reference DAC edge pulse generator is configured and disposed to receive the second input signal.

2. The system of claim 1, wherein the phase separation module comprises:
 a rising separation circuit configured and disposed to generate a rising integrative signal; and
 a falling separation circuit configured and disposed to generate a falling integrative signal.

3. The system of claim 2, wherein the rising separation circuit comprises:
 a first rising edge pulse generator configured and disposed to receive the first input signal;
 a second rising edge pulse generator configured and disposed to receive the second input signal;
 a first set-reset latch comprising a first set input, a first reset input and a first latch output, wherein the first set-reset latch is configured and disposed to receive an output of the first rising edge pulse generator at the first set input and configured and disposed to receive an output of the second rising edge pulse generator at the first reset input;
 a rising edge integrator, wherein the rising edge integrator is configured and disposed to receive the first latch output and generate the rising integrative signal; and
wherein the falling separation circuit comprises:
 a first falling edge pulse generator configured and disposed to receive the first input signal;
 a second falling edge pulse generator configured and disposed to receive the second input signal;
 a second set-reset latch comprising a second set input, a second reset input and a second latch output, wherein the second set-reset latch is configured and disposed to receive an output of the first falling edge pulse generator at the second set input and configured and disposed to receive an output of the second falling edge pulse generator at the second reset input;
 a falling edge integrator, wherein the falling edge integrator is configured and disposed to receive the second latch output and generate the falling integrative signal.

4. The system of claim 2, wherein the output signal generation circuit of the phase creator module comprises:
 a first voltage comparator configured and disposed to receive the DAC output voltage signal and the rising integrative signal, and generate a rising output signal;
 a second voltage comparator configured and disposed to receive the DAC output voltage signal and the falling integrative signal, and generate a falling output signal;
 a third set-reset latch, comprising a third set input, a third reset input and a third latch output, wherein the third set-reset latch is configured and disposed to receive the rising output signal at the third set input and configured and disposed to receive the falling output signal at the third reset input, and generate a phase shifted output at the third latch output.

5. The system of claim 4, wherein the output signal generation circuit of the phase creator module further comprises:
 a third rising edge pulse generator configured and disposed to receive the rising output signal and provide an output signal to the third set input; and
 a fourth rising edge pulse generator configured and disposed to receive the falling output signal and provide an output signal to the third reset input.

6. The system of claim 2, wherein the sample-and-hold circuit is configured and disposed to receive the rising integrative signal.

7. The system of claim 2, wherein the sample-and-hold circuit is configured and disposed to receive the falling integrative signal.

8. A system for providing a programmable clock phase, comprising:
 a phase separation module configured and disposed to receive a first input signal and a second input signal and generate an integrative signal; wherein the phase separation module comprises:
 an XOR gate configured and disposed to receive the first input signal and the second input signal, and generate an RFCLK signal;
 a first rising edge pulse generator and a falling edge pulse generator configured and disposed to receive the second input signal;
 an OR gate configured and disposed to receive an output of the first rising edge pulse generator and the falling edge pulse generator and generate an RST_RF signal;
 an integrator, configured and disposed to receive the RFCLK signal at a signal input, and configured and disposed to receive the RST_RF signal at a reset input, and generate an RF_INT signal;

a reference DAC supply module configured and disposed to receive a signal from the phase separation module and output a DAC reference voltage, wherein the reference DAC supply module comprises:

a sample-and-hold circuit configured and disposed to receive the RF_INT signal;

a reference DAC edge pulse generator configured to activate the sample-and-hold circuit, wherein the reference DAC edge pulse generator is configured and disposed to receive the second input signal;

a phase creator module, comprising a DAC and an output signal generation circuit, and wherein the phase creator module is configured to use the DAC reference voltage as an input to the DAC, and wherein a DAC output voltage signal is configured to control the output signal generation circuit.

9. The system of claim 8, wherein the output signal generation circuit of the phase creator module further comprises:

a voltage comparator configured and disposed to receive the DAC output voltage signal and the RF_INT signal, and generate an RF_OUT signal.

10. The system of claim 9 further comprising a flip-flop comprising a clock input and an output, the flip-flop configured and disposed to receive the RF_OUT signal at a clock input and generate a phase shifted output.

11. The system of claim 10, wherein the flip-flop is a D flip-flop comprising a Q output, a Q-complement output, a clock input, and a D input, and wherein the Q-complement output is connected to the D input.

12. The system of claim 8, wherein the reference DAC edge pulse generator is a rising edge pulse generator.

13. The system of claim 8, wherein the reference DAC edge pulse generator is a falling edge pulse generator.

14. A method for generating a programmable clock phase, comprising:

receiving a first input signal and a second input signal, wherein the second input signal is a phase-shifted signal of similar frequency as the first input signal;

generating an integrative signal proportional to a phase difference between the first input signal and the second input signal;

generating a DAC reference voltage as a function of the integrative signal;

inputting the DAC reference voltage into a DAC in a phase creation module;

outputting a phase-shifted clock signal from the phase creation module, wherein the phase-shifted clock signal is a function of the DAC reference voltage;

wherein generating an integrative signal proportional to a phase difference between the first input signal and the second input signal comprises:

converting a time interval between a rising edge of the first input signal and a rising edge of the second input signal to a pulse signal; and performing a time-to-voltage conversion of the pulse signal via an integrator.

15. The method of claim 14, wherein generating a DAC reference voltage as a function of the integrative signal comprises performing a sample-and-hold of the integrative signal at a rising edge of the second input signal.

16. The method of claim 14, wherein generating a DAC reference voltage as a function of the integrative signal comprises performing a sample-and-hold of the integrative signal at a falling edge of the second input signal.

17. The method of claim 14, wherein generating an integrative signal proportional to a phase difference between the first input signal and the second input signal comprises:

generating a pulse signal having a width proportional to the phase difference between the first input signal and the second input signal;

generating an integrator reset signal based on a logical OR of a pulse generated at a rising edge of the second input signal and a pulse generated at a falling edge of the second input signal;

performing a time-to-voltage conversion of the pulse signal via an integrator; and resetting the integrator with the integrator reset signal.

18. The method of claim 14, further comprising:

adjusting a DAC output signal based on an input vector, and generating a phase-rotated output signal, wherein phase of the phase-rotated output signal is a function of the input vector and the DAC reference voltage.

* * * * *